United States Patent
Vydolob

(10) Patent No.: US 9,444,471 B2
(45) Date of Patent: Sep. 13, 2016

(54) PHASE DETECTOR AND PHASE-LOCKED LOOP

(71) Applicant: Gennady Mihaylovich Vydolob, Moscow (RU)

(72) Inventor: Gennady Mihaylovich Vydolob, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/895,267

(22) PCT Filed: Jun. 6, 2013

(86) PCT No.: PCT/RU2013/000469
§ 371 (c)(1),
(2) Date: Dec. 2, 2015

(87) PCT Pub. No.: WO2014/196890
PCT Pub. Date: Dec. 11, 2014

(65) Prior Publication Data
US 2016/0126963 A1    May 5, 2016

(51) Int. Cl.
*H03L 7/089* (2006.01)
*H03D 13/00* (2006.01)
*H03L 7/091* (2006.01)
*H03L 7/107* (2006.01)

(52) U.S. Cl.
CPC .......... *H03L 7/0891* (2013.01); *H03D 13/004* (2013.01); *H03L 7/089* (2013.01); *H03L 7/091* (2013.01); *H03L 7/1077* (2013.01)

(58) Field of Classification Search
CPC ..... H03L 7/085; H03L 7/089; H03L 7/0891; H03L 7/091; H03D 13/003; H03D 13/004; G01R 25/00; G01R 25/005
See application file for complete search history.

(56) References Cited

U.S. PATENT DOCUMENTS

| | | |
|---|---|---|
| 3,610,954 A | 10/1971 | Treadway |
| 4,027,262 A | 5/1977 | Sharpe |
| 5,631,582 A | 5/1997 | Fujikawa |
| 5,736,872 A | 4/1998 | Sharma et al. |
| 6,002,273 A | 12/1999 | Humphreys |
| 6,192,094 B1 | 2/2001 | Herrmann et al. |
| 6,329,847 B1 | 12/2001 | Chabas |

(Continued)

FOREIGN PATENT DOCUMENTS

GB    2161660    1/1986

OTHER PUBLICATIONS

International Search Report and Written Opinion correlating to PCT/RU2013/000469 issued on Feb. 12, 2014.

(Continued)

*Primary Examiner* — Patrick O'Neill
(74) *Attorney, Agent, or Firm* — Charlene R. Jacobsen

(57) ABSTRACT

A phase detector for generating a phase difference signal indicative of a phase difference between a first bi-level signal of frequency F1 and a second bi-level signal of frequency F2 is proposed. The phase detector may include first and second detector inputs, first and second flip-flops, a NAND gate, and a first and second overphase detection units. An output of the first overphase detection unit may be connected to a direct input of the second flip-flop and may be arranged to output the level "1" in response to F1≤F2 and the level "0" in response to F1>F2. An output of the second overphase detection unit may be connected to a direct input of the first flip-flop and may be arranged to output the level "1" in response to F2≤F1 and the level "0" in response to F2>F1.

7 Claims, 11 Drawing Sheets

(56) References Cited

U.S. PATENT DOCUMENTS

| | | | |
|---|---|---|---|
| 6,407,642 B2 * | 6/2002 | Dosho | H03D 13/004 |
| | | | 327/156 |
| 6,617,884 B2 | 9/2003 | Wang et al. | |
| 7,042,970 B1 | 5/2006 | Keaveney et al. | |
| 7,092,475 B1 | 8/2006 | Huard | |
| 7,242,256 B2 | 7/2007 | Chien | |
| 7,327,196 B2 * | 2/2008 | Goldberg | H03L 7/085 |
| | | | 331/10 |
| 7,567,642 B2 * | 7/2009 | White | H03D 13/004 |
| | | | 375/236 |
| 7,728,631 B2 | 6/2010 | Nathawad | |
| 7,876,871 B2 | 1/2011 | Zhang | |
| 7,940,088 B1 * | 5/2011 | Sampath | G01R 25/02 |
| | | | 327/12 |
| 9,094,025 B1 * | 7/2015 | Cheng | H03L 7/093 |
| 2009/0278618 A1 | 11/2009 | Lipan | |

OTHER PUBLICATIONS

Toumazou, Chris et al., "Trade-offs in Analog Circuit Design: The Designer's Companion, Part II", p. 826, Figure 28.6, 2004.

* cited by examiner

PHASE DETECTOR AND PHASE-LOCKED LOOP

FIELD OF THE INVENTION

This invention relates to a phase detector and to a phase-locked loop.

BACKGROUND OF THE INVENTION

FIG. 1 schematically shows an example of an embodiment of a phase-locked loop (PLL) 30. The PLL 30 may comprise, for example, a phase detector 32, a charge pump 34, a filter 36, an oscillator 38, and a frequency divider 40. In the shown example, the phase detector 32 is a phase-frequency detector (PFD). The oscillator 38 may be a voltage controlled oscillator (VCO) or any other kind of oscillator having a controllable frequency Fout (oscillator frequency). The frequency divider 40 may form part of a feedback loop arranged to ensure that the oscillator Fout becomes substantially identical to the frequency (reference frequency) Fref of a reference signal Sref and to lock the phase of the oscillator signal relative to the phase of the reference signal Sref.

The PFD 32 may have a first detector input 16 and a second detector input 17. The reference signal may be fed to the first detector input 16 as a first detector input signal S1. A feedback signal, with a frequency (feedback frequency) Ffb, may be generated by the frequency divider 40 in dependence of the oscillator signal and fed to the second detector input 17 as a second detector input signal S2. The reference signal and the feedback signal may be bi-level signals. A bi-level signal is a signal with only two allowed values, e.g., low and high or, equivalently, 0 and 1.

The PFD 32 may further have a first detector output 18 and a second detector output 19. The PFD 32 may be arranged to generate a phase difference signal (detector output signal) UP, DOWN in dependence of the reference signal and the feedback signal and to deliver the detector output signal via the first detector output 18 and the second detector output 19.

When the reference frequency Fref and the frequency Ffb are substantially equal, the detector output signal may be indicative of the phase difference between the feedback signal and the reference signal. The indicated phase difference may for example be restricted to the range of $-\pi$ (or $-180$ degrees) and $+\pi$ (or $+180$ degrees). The detector output signal may for instance be provided in terms of a first detector output signal (UP signal) and a second detector output signal (DOWN signal). The UP signal, provided for instance at the first detector output 18, and the DOWN signal, provided for instance at the second output 19, may be bi-level signals, for example.

When the phase difference is positive, its absolute value may for instance be represented by a duty cycle of the UP signal. A duty cycle may be defined as the duration of the HIGH phase of a periodic bi-level signal, that is the phase in which the signal is HIGH or at level "1" within a period. The duty cycle may be measured in periods of the signal and may then have a value in the range of 0 to 1. When the phase difference is positive, the duty cycle of the DOWN signal may be 0.

When the phase difference is negative, the duty cycle of the DOWN signal may indicate the absolute value of the phase difference between the reference signal and the feedback signal. The duty cycle of the UP signal may then be 0.

The phase difference $\Delta\phi$ may thus be expressed as $\Delta\phi=\pi^*$(DC_UP$-$DC_DOWN) wherein DC_UP and DC_DOWN are the duty cycles of the UP signal and the DOWN signal, respectively. Accordingly, the phase difference may be determined from the UP signal and the DOWN signal as $\Delta\phi=\pi^*$DC_UP when the phase difference is positive and $\Delta\phi=\pi^*$DC_DOWN when the phase difference is negative.

The detector output signal, i.e., a phase difference signal formed of the pair of signals UP and DOWN, may drive the charge pump 34 to translate the detector output signal into, e.g., a voltage corresponding to the phase difference. The thus generated voltage indicative of the phase difference may be fed to the voltage controlled oscillator 38. In the shown example, the voltage generated by the charge pump 34 may be fed to the VCO 38 via the filter 36. The filter 36 may be a low pass filter for filtering out possible high frequency components from the charge pump output signal. The filter 36 may thus contribute to the stability of the feedback loop. The controlled signal which is applied at the VCO 38 and which may be indicative of the phase difference between the feedback signal and the reference signal may be referred to as the VCO control signal. In the shown example, the VCO control signal may be generated from the phase detector output signal 18, 19 by means of the charge pump 34 and the filter 36. However, circuitry different from the units 34 and 36 shown here may be envisioned.

The VCO 38 may be arranged to adapt its oscillation frequency Fout in dependence of the VCO control signal. For instance, the VCO may decrease its oscillation frequency Fout in response to the VCO control signal indicating that the phase difference $\Delta\phi$ is positive. Similarly, the VCO 38 may increase its oscillation frequency Fout in response to the VCO control signal indicating that the phase difference is negative. The phase and frequency of the VCO output signal may thus be locked to the reference signal.

The scenario may be more complex when the frequency Ffb of the feedback signal and the frequency Fref of the reference signal differ. If, for example, the reference frequency is greater than the feedback frequency, the phase of the reference signal relative to a phase of the feedback signal will increase. When the phase difference indicated by the phase difference signal UP, DOWN is restricted to a range of, e.g., $-\pi$ to or, e.g., 0 to $2^*\pi$, the indicated phase difference may increase in time continuously until it reaches the maximum phase difference value of, e.g., $+\pi$ and then drop to its minimum allowed value of, e.g., $-\pi$. Generally, the phase difference indicated by the phase difference signal UP, DOWN produced by phase detector 32 may therefore be a discontinuous function of time.

FIG. 2 schematically illustrates an example of a phase detector 32 connected to a charge pump 34 (cf. "Trade-Offs in Analog Circuit Design: The Designer's Companion, Part II", edited by Chris Toumazou, George S. Moschytz, and Barrie Gilbert, page 826, FIG. 28 6). The phase detector 32 may for example be the one shown in FIG. 1 as part of the PLL 30. The phase detector 32 may be arranged to measure a phase difference $\Delta\phi$ between a first bi-level signal (first detector input signal) S1 of frequency F1 and a second bi-level signal S2 (second detector input signal) S2 of frequency F2. The first bi-level signal S1 and the second bi-level signal S2 may be the reference signal Sref and the feedback signal Sfb. They may, for example, be provided in the form of voltages Vref and Vdiv. The phase detector 32 may comprise a first detector input 16 for receiving the first bi-level signal S1, a second detector input 17 for receiving the second bi-level signal S2, a first flip-flop 4, a second flip-flop 5, and a AND gate 7. The first detector input 16 may be connected to a clock input CLK of the first flip-flop 4. The second detector input 17 may be connected to a clock input CLK of the second flip-flop 5. A direct output UP of the first flip-flop 4 may be connected to a first input 20 of the AND gate 7. A direct output DN of the second flip-flop 5 may be connected to a second input 21 of the AND gate 7. An output of the AND gate 7 may be connected to an reset R of the first flip-flop 4 and to a reset input R of the second flip-flop 5.

A constant level of "1" or "high" may be applied at a direct input D of the first flip-flop 4 and at a direct input D of the second flip-flop 5. The direct output UP of the first flip-flop 4 and the direct output DN of the second flip-flop 5 may represent the first detector output 18 and the second detector output 19. The first detector output 18 and the second detector output 19 may be connected to a first switch and to a second switch, respectively, of the charge pump 34. The first switch of the charge pump 34 may be connected in series with a first current source P. The second switch of the charge pump 34 may be connected in series with a second current source N. The first switch may be arranged to be on, i.e. conductive, when the UP signal, i.e. the first detector output signal, is high and off, i.e. non conductive, when the UP signal is low. Similarly, the second switch may be arranged to be on when the second detector output signal is high and off when the second detector signal is low. An output node CPout of the charge pump 34 may thus provide a current ID which is a current pushed by the first current source P minus a current pulled by the second current source N. The current pushed by the first current source P when the first switch is closed (i.e. on or conductive) and the current pulled by the second current source N when the second switch is closed (i.e. on or conductive) may have the same amplitude. A time average of the output current ID may thus be proportional to the duty cycle of the UP signal minus the duty cycle of the DOWN signal. The time average of the output current ID may thus provide a measure of the phase difference between the first detector input signal Vref and the second detector input signal Vdiv.

More specifically, the phase detector 32 shown in FIG. 2 may operate as follows. If a rising edge of Vref is first, the first flip-flop 4 may be set to level 1. This state, i.e. the level 1, may be saved until the next rising edge of Vdiv which may set the second flip-flop 5 to level 1 for a brief moment. The AND gate 7 may then reset both flip-flops 4 and 5 to their initial states (level 0). The width of the UP signal may thus be proportional to the phase difference of the detector input signals Vref and Vdiv when the phase difference is positive.

Similarly, in another scenario the rising edge of Vdiv may be first and the second flip-flop may be set to level 1. The width of the signal DN may then be proportional to the negative phase difference of the detector input signals Vref and Vdiv.

The charge pump 34 may convert the widths of signals UP and DOWN with their signs to the output current ID. The filter 36 may convert this current to a voltage which may adjust the frequency of the voltage controlled oscillator 38.

This conventional phase detector may have linear phase characteristics for a phase difference from −2*π to +2*π, i.e. for equal frequencies of the input signals Vref and Vdiv, but exhibit sawtooth phase characteristics beyond this interval.

SUMMARY OF THE INVENTION

The present invention provides a phase detector and a phase-locked loop as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
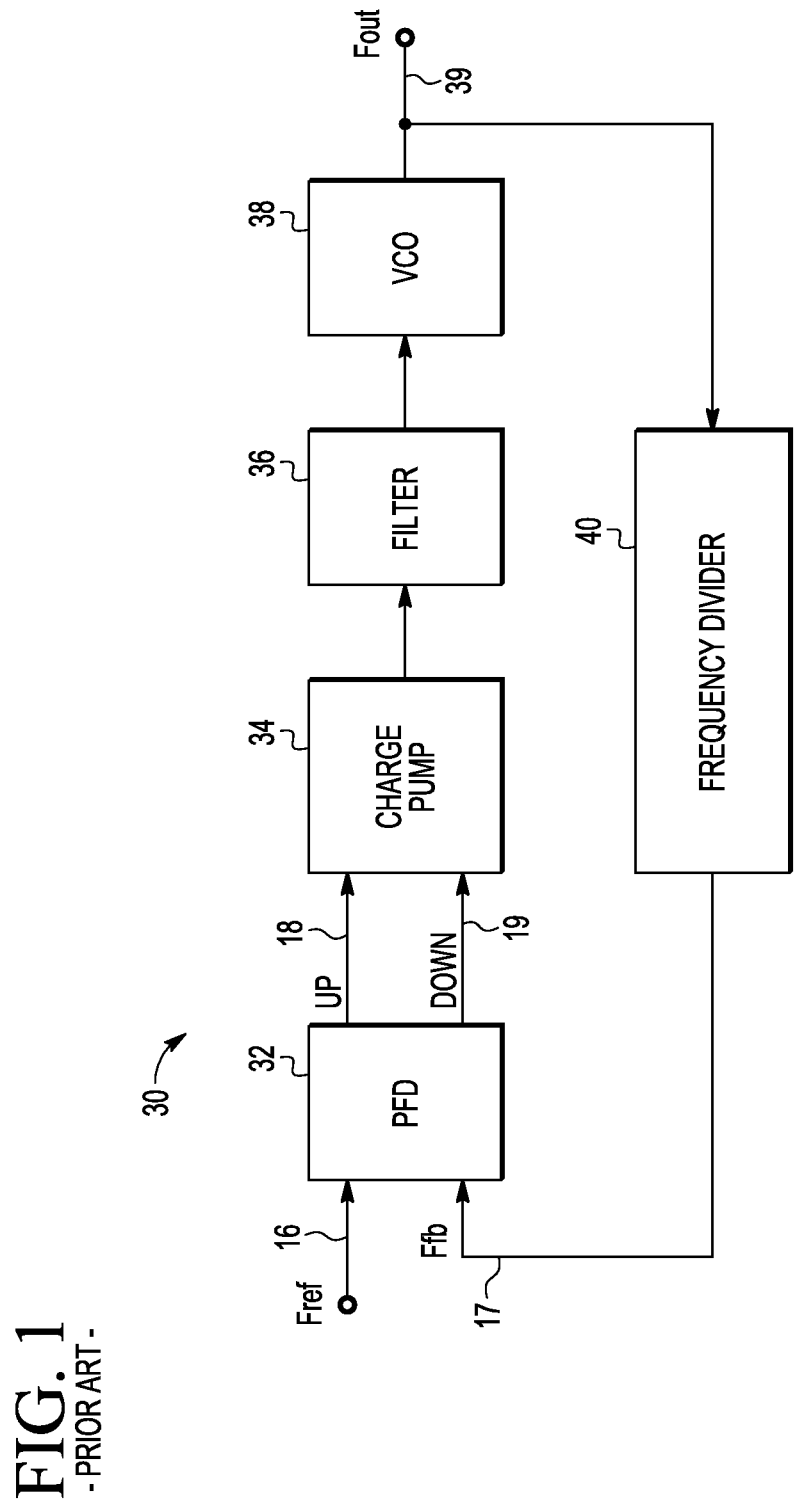
FIG. 1 schematically shows an example of an embodiment of a PLL.
Figure 2:
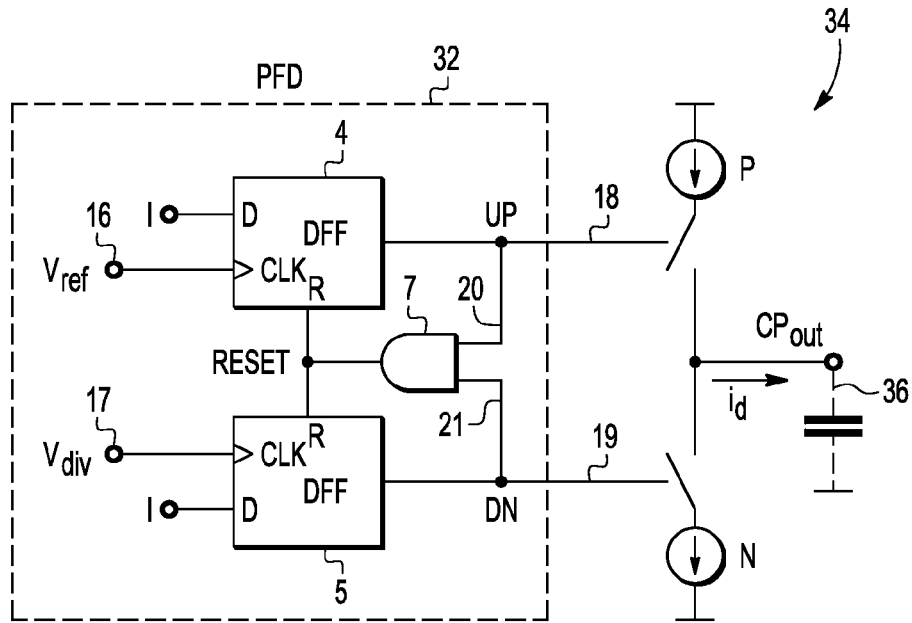
FIG. 2 schematically shows an example of an embodiment of a phase detector connected to a charge pump, along with a diagram of an example of signals received or generated by the phase detector and the charge pump, and a diagram of an example of an average current produced by the charge pump.
Figure 2:
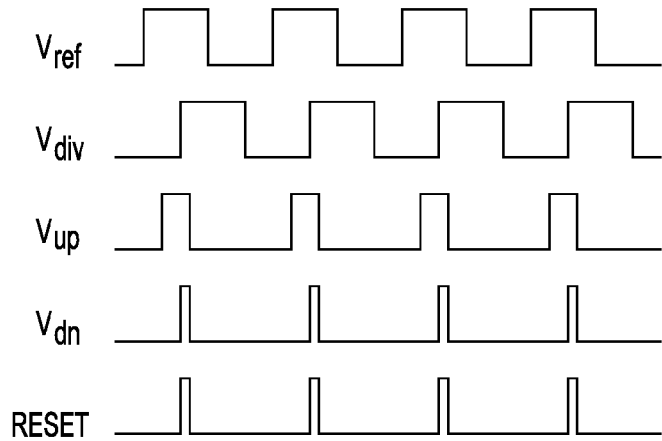
Figure 2:
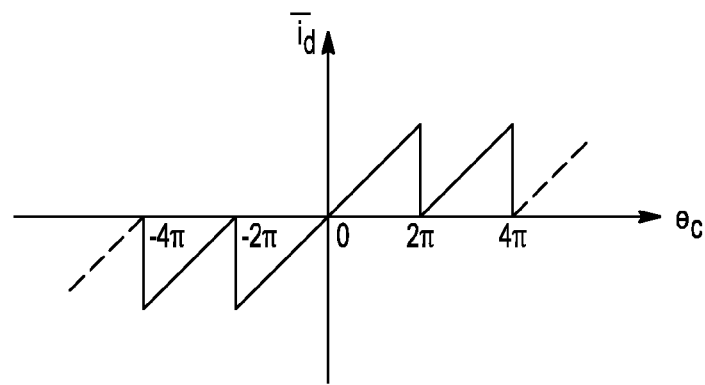
Figure 3:
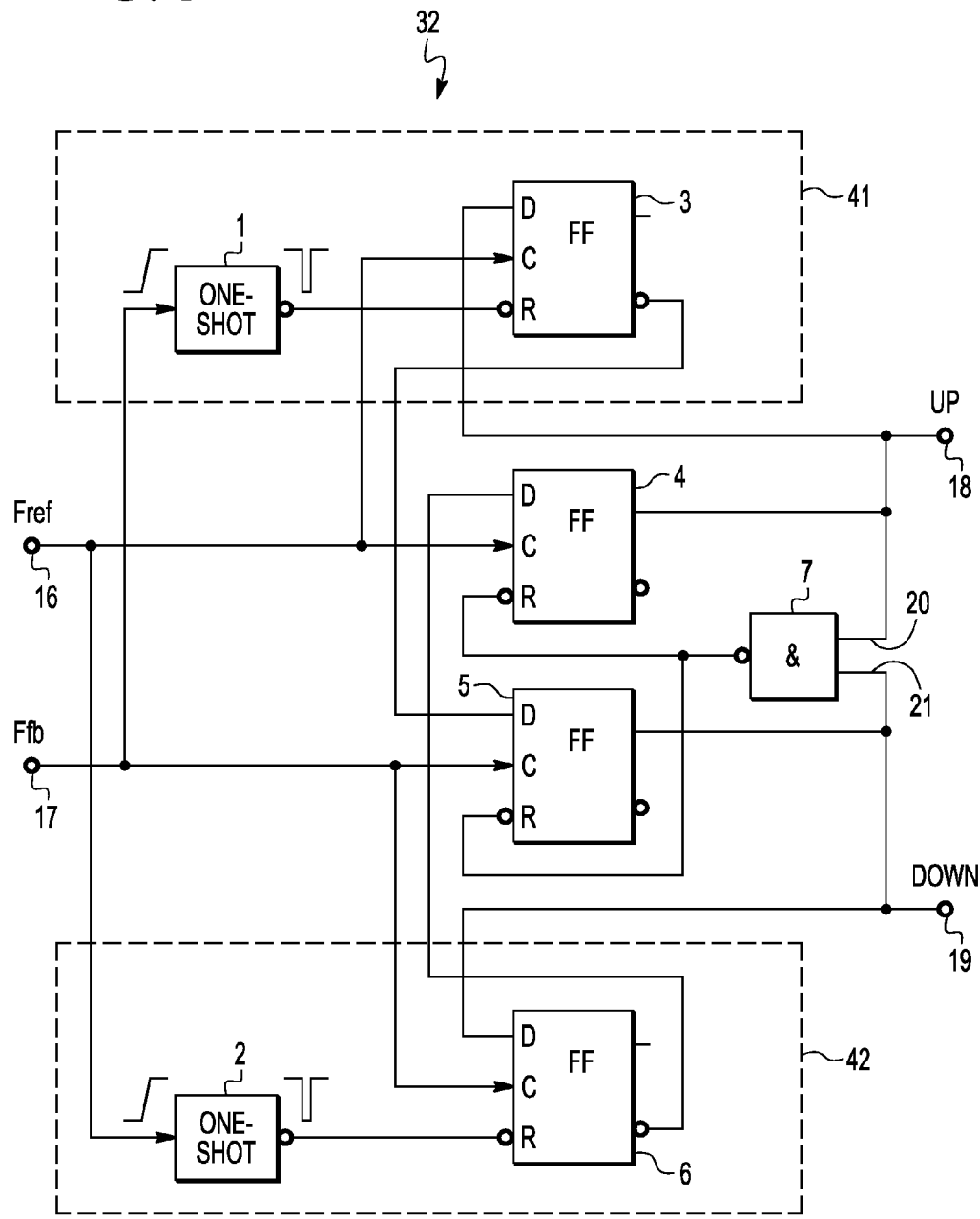
FIG. 3 schematically shows an example of an embodiment of a phase detector.

FIG. 3 schematically illustrates an example of a modified version of the phase detector 32 described above in reference to FIG. 2. The present example of a phase detector 32 may differ from the one of FIG. 2 notably in that the voltage applied at the direct input D of the first flip-flop 4 as well as the voltage applied at the direct input D of the second flip-flop 5 is not necessarily constant but generated in dependence of the first bi-level signal (first detector input signal) S1 received at, e.g., the first detector input 16 and the second bi-level signal (second detector input signal) S2 received at, e.g., the second detector input 17 and in dependence of the direct output of the flip-flops 4 and 5.

More specifically, the phase detector 32 may comprise a first overphase detection unit 41 and a second overphase detection unit 42.

An output of the first overphase detection unit 41 may be connected to the direct input D of the second flip-flop 5. The first overphase detection unit 41 may be arranged to output, at this output, the level 1 in response to F1 being less than or equal to F2 and to output the level 0 in response to F1 being greater than F2, wherein F1 and F2 are the frequencies of the first detector input signal and the second detector input signal, respectively. For example, F1 and F2 may be the reference frequency Fref and the feedback frequency Ffb, respectively, or vice versa.

Similarly, an output of the second overphase detection unit 42 may be connected to the direct input D of the first flip-flop 4 and the second overphase detection unit 42 may be arranged to output, and this output, the level 1 in response to F2 being less than or equal to F1 and the level 0 in response to F2 being greater than F1.

It may thus be ensured that the signal UP is high and the signal DOWN is low when the first input frequency F1, e.g., Fref, is greater than the second input frequency F2, e.g., Ffb. Furthermore, it may be ensured that the signal UP is low and the signal DOWN is high when the second input frequency, e.g., Ffb, is greater than the first input frequency, e.g., Fref. Accordingly, the phase difference indicated by the combination of the signals UP and DOWN may be a monotonic function of the phase difference between the two input signals at the input 16, 17. The signals UP and DOWN notably lack the sawtooth characteristic mentioned above.

In the present example, the first overphase detection unit 41 may comprise a third flip-flop 3 and a first rising edge detector 1. The direct output D of the first flip-flop 4 may be connected to a direct input D of the third flip-flop 3. The first detector input 16 may be connected to a clock input C of the third flip-flop 3. The second detector input 17 may be connected to an input of the first rising edge detector 1. An output of the first rising edge detector 1 may be connected to an inverse input R of the third flip-flop 3 and arranged to output a level 0 pulse in response to a rising edge of the second bi-level signal. An inverse output of the third flip-flop 3 may be connected to the direct input D of the second flip-flop 5. The inverse output of the third flip-flop 3 may thus act as the output of the first overphase detection unit 41.

The second overphase detection unit 42 may be similar or identical to the first overphase detection unit 41. Notably, the second overphase detection unit 42 may comprise a fourth flip-flop 6 and a second rising edge detector 2. The direct output of the second flip-flop 5 may be connected to a direct input D of the fourth flip-flop 6. The first detector input 16 may be connected to an input of the second rising edge detector 2. The second detector input 17 may be connected to a clock input C of the fourth flip-flop 6. An output of the second rising edge detector 2 may be connected to an inverse input R of the fourth flip-flop 6 and may be arranged to output a level 0 pulse in response to a rising edge of the first bi-level signal. An inverse output of the fourth flip-flop 6 may be connected to the direct input D of the first flip-flop 4. The inverse output of the fourth flip-flop 6 may thus act as the output of the second overphase detection unit 42.

Figure 4:
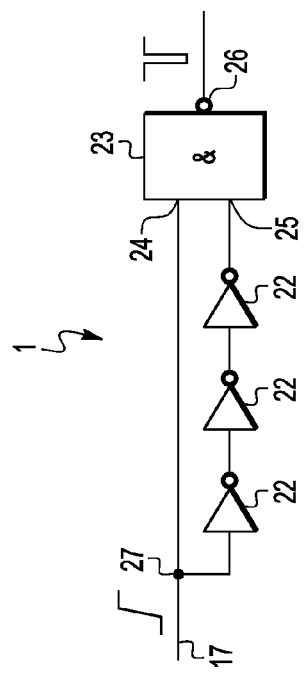
FIG. 4 schematically shows an example of an embodiment of a rising edge detector.

An example of a rising edge detector, e.g., the rising edge detector 1 in FIG. 3, is schematically shown in FIG. 4. The rising edge detector 1 may, for example, comprise a NAND gate 23 having a first input 24, a second input 25, and an output 26. An input 27 of the rising edge detector 1 may be connected to the first input 24 of the NAND gate 23 via a first branch and to the second input 25 via a second branch. The second branch may be arranged to delay and invert the signal. The second branch may to this end comprise an odd number of inverters 22 connected in series. The first branch may be a direct connection. In the event of a rising edge, the inputs 24 and 25 are both high for a brief moment, namely when the rising edge has arrived at the first input 24 but has not yet arrived at the second input 25. The NAND gate 23 may thus produce a pulse of level 0.

Figure 5:
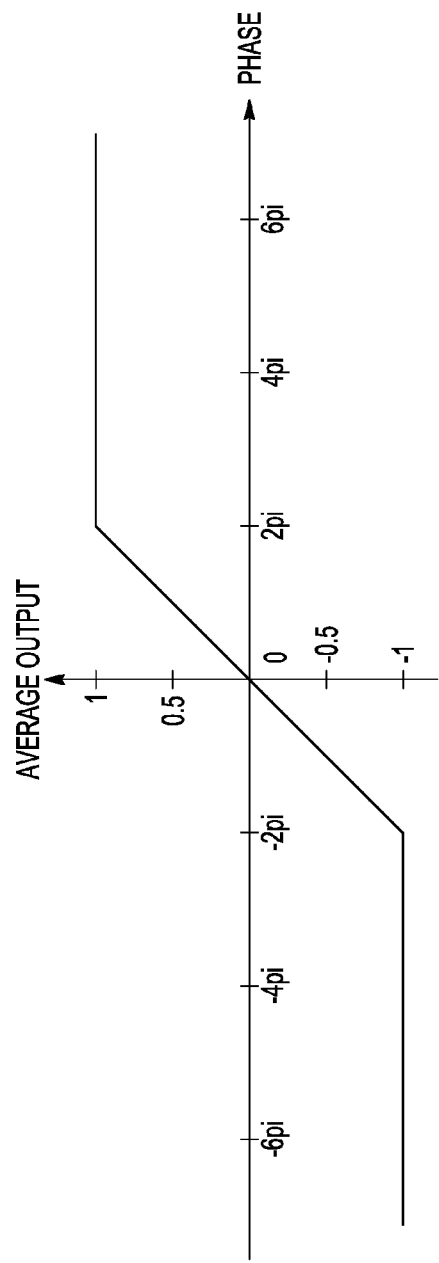
FIG. 5 shows a schematic diagram of a phase difference determined by the phase detector of FIG. 3 as a function of a theoretical phase difference.

FIG. 5 shows a diagram of the measured phase difference $\Delta\phi$, i.e. the value of the phase difference signal, in units of $\pi$ as a function of the phase difference between the first input signal and the second input signal of the phase detector 32 shown in FIG. 3. As a consequence of the first overphase detection unit 41 and the second overphase detection unit 42, the phase detector output signal exhibits a saturation effect. For an input phase difference greater than $2*\pi$ the phase detector 32 may indicate a phase difference of $2*\pi$. Similarly, when the input phase difference is less than $-2*\pi$, the phase detector 32 may indicate a phase difference of $-2*\pi$. Using the phase detector 32 in a PLL may result in a fast locking time of the PLL. It may be noted at this point that a PPL with a similar saturation effect is known from U.S. Pat. No. 6,617,884. However, it appears that the phase detector proposed therein may be quite sensitive to delay variation of its logic elements. In contrast, the phase detectors described herein in reference to FIGS. 3 to 12 may be less sensitive to delay variation of their logic elements and require fewer logic elements while also providing saturation and maximum output when the frequencies F1 and F2 of the detector input signals differ.

Returning back to FIG. 3, an example of operation of the phase detector 32 may be explained as follows.

For the purpose of explanation, the detector input signals S1 and S2, with frequencies F1 and F2, are assumed to be the reference signal Sref and the feedback signal Sfb, with frequencies Fref and Ffb, respectively. It is pointed out, however, that the phase detector 32 may also be operated in a circuit or device different from a PLL and that its input signals may therefore be signals other than a reference signal and a feedback signal.

Three different cases of relations of input frequencies need to be considered: Fref=Ffb, Fref>Ffb and Fref<Ffb.

In the first case (Fref=Ffb), the flip-flops 4, 5 and the NAND gate 7 may operate as in the basic phase detector 32 shown in FIG. 2 because the flip-flops 3, 6 provide level 1 on the D inputs of the flip-flops 4, 5.

In the second case (Fref>Ffb), the pulse sequence of the reference signal Sref (from the detector input 16) will move relative to the pulse sequence of the feedback signal Sfb (from the second detector input 17). After a certain time, two positive edges of Sref will be located between adjacent positive edges of Sfb. The first positive edge of Sref may set level 1 on the direct output of flip-flop 4 (output UP) The second positive edge of Sref may then set level 1 on the direct output of flip-flop 3 and level 0 on the inverse output of flip-flop 3 and on the D input of flip-flop 5. The output of flip-flop 5 (output DOWN) may therefore provide the constant level 0 and the output of flip-flop 4 (output UP) may provide the constant level 1. Every next rising edge (positive edge) of Sfb may reset flip-flop 3 through the rising edge detector 1, but every next positive edge of Sref will set flip-flop 3 to level 1 again. Thus a positive saturation of the phase detector 32 may be observed. Two positive edges of Sfb located between adjacent to positive edges of Sref may prompt the phase detector 32 to return to its initial state.

In the third case (Fref<Ffb), the pulse sequence of the feedback signal Sfb will move relative to the pulse sequence of the reference signal Sref. After a certain time, two positive edges of Sfb will be located between adjacent positive edges of Sref. The first positive edge of Sfb will set level 1 on the output of flip-flop 5 (output DOWN). The second positive edge of Sfb will set level 1 on the direct output of flip-flop 6 and level 0 on the inverse output of flip-flop 6 and on the D input of flip-flop 4. The output of flip-flop 4 (output UP) will therefore provide the constant level 0 and the output of flip-flop 5 (output DOWN) will provide the constant level 1. Every next positive edge of Sref will reset the flip-flop 6 through the rising edge detector 2 and every next positive edge of Sfb will set flip-flop 6 to level 1 again. Negative saturation of the phase detector 32 may thus be observed. The phase detector 32 may return to its initial state in response to two positive edges of Sref being located between adjacent positive edges of Sfb.

It should be pointed out that both the positive saturation effect and the negative saturation effect produce the full output value, namely $2*\pi$ in the case of positive saturation and $-2*\pi$ in the case of negative saturation. A full output value during a PLL capture process may decrease the time to achieve phase look. Moreover, the phase detector 32 may be fairly robust against delay variation of its logic elements.

Figure 6:
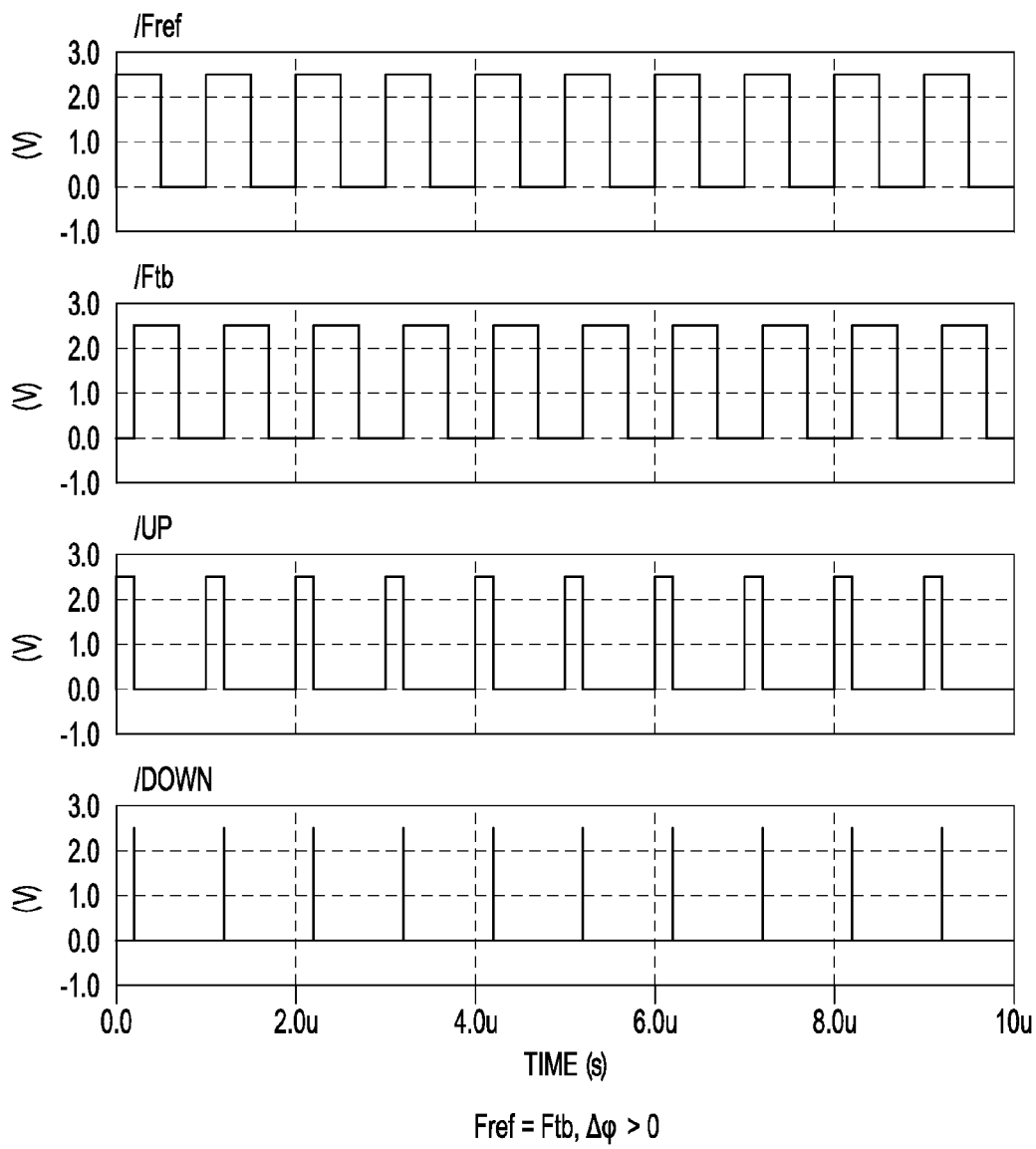
FIG. 6 shows a diagram of the reference signal, the feedback signal, an UP signal, and the DOWN signal of the phase detector of FIG. 3, for a first example scenario.
Figure 7:
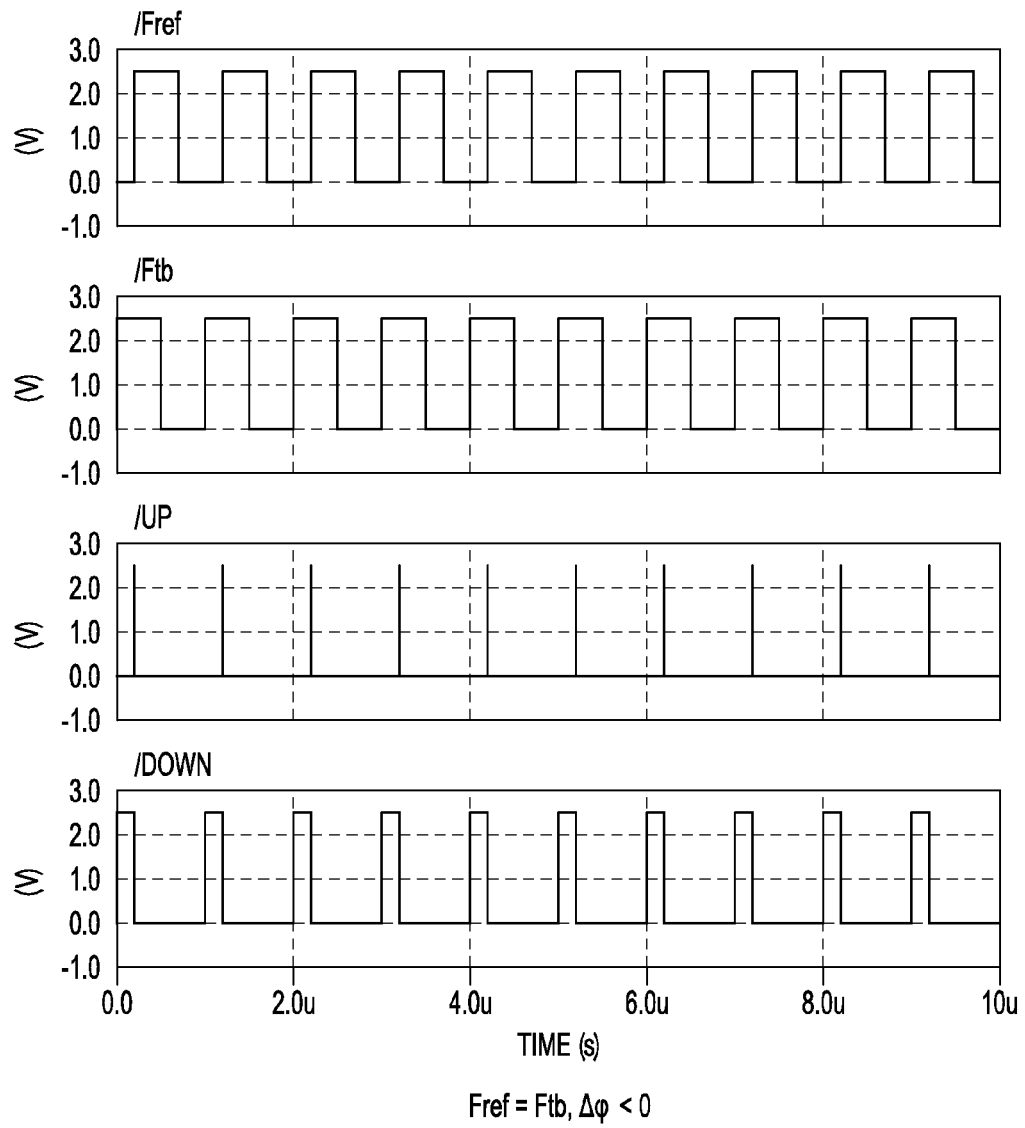
FIG. 7 shows a diagram of the reference signal, the feedback signal, an UP signal, and the DOWN signal of the phase detector of FIG. 3, for a second example scenario.
Figure 8:
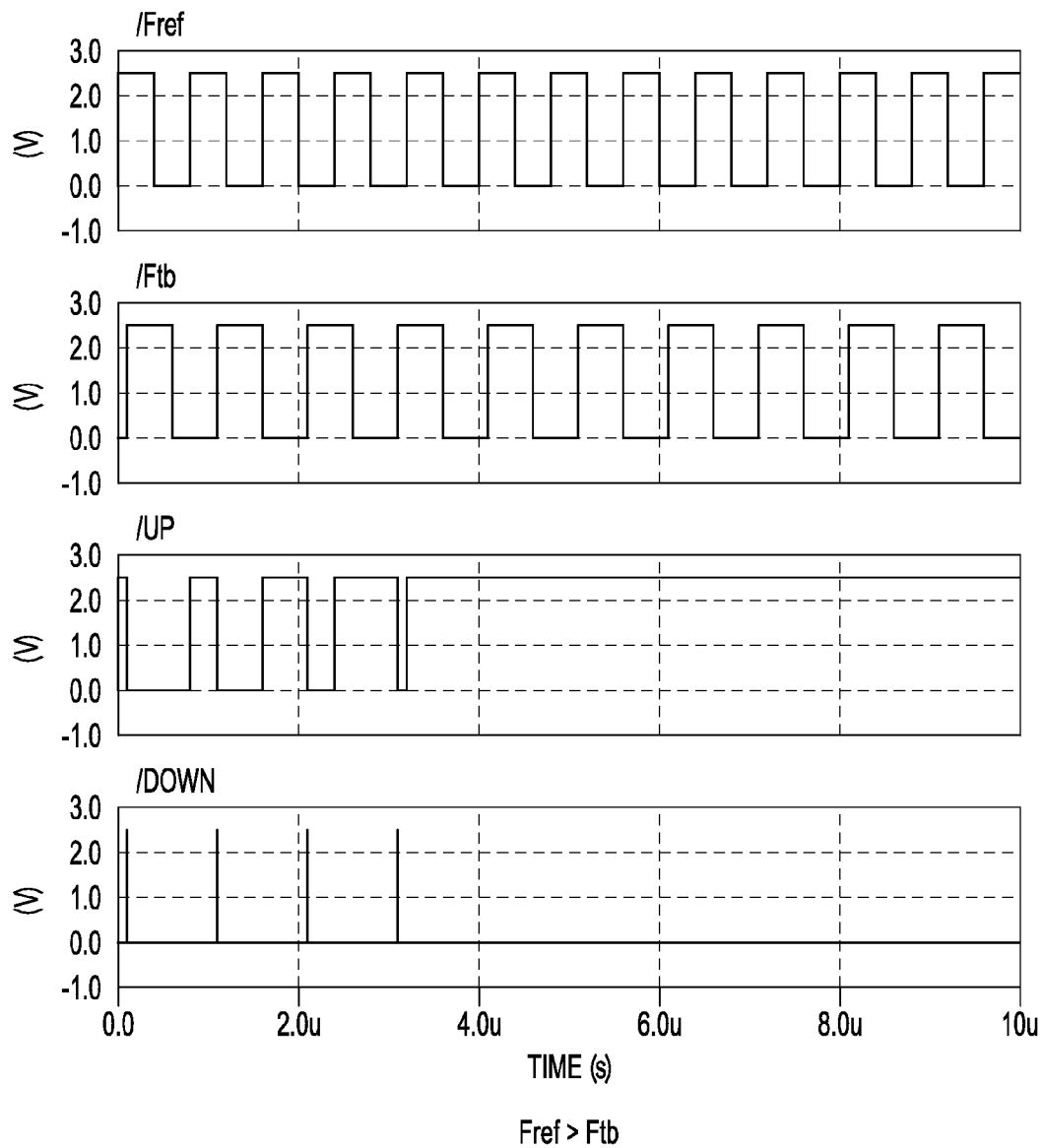
FIG. 8 shows a diagram of the reference signal, the feedback signal, the UP signal, and the DOWN signal of the phase detector of FIG. 3, for a third example scenario.
Figure 9:
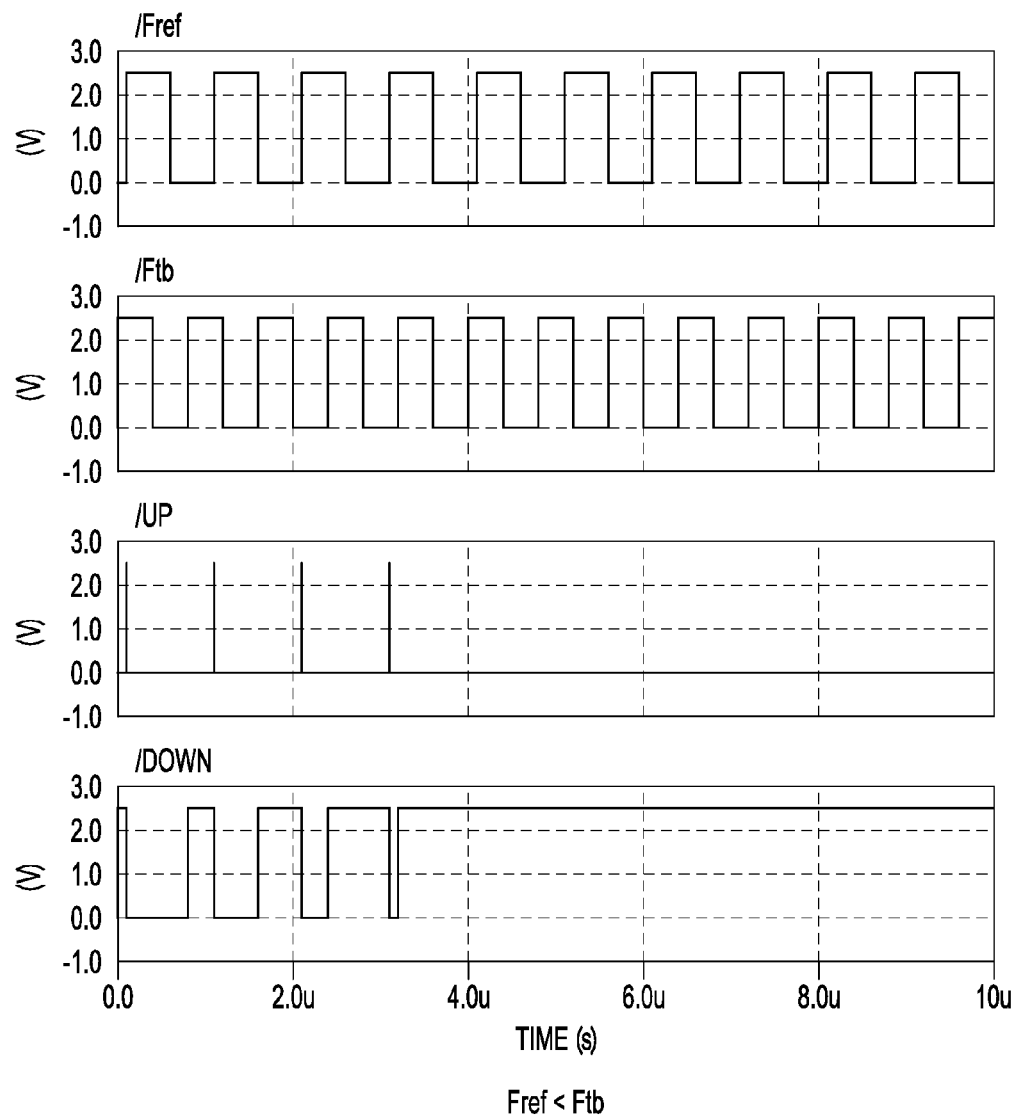
FIG. 9 shows a diagram of the reference signal, the feedback signal, the UP signal, and the DOWN signal of the phase detector of FIG. 3, for a fourth example scenario.

FIGS. 6 to 9 show simulation results for the phase detector 32 of FIG. 3 for the following scenarios: Fref=Ffb, $\Delta\phi>0$ (FIG. 6); Fref=Ffb, $\Delta\phi<0$ (FIG. 7), Fref>Ffb (FIG. 8); Fref<Ffb (FIG. 9), wherein $\Delta\phi$ is the phase of the reference signal Sref minus the phase of the feedback signal Sfb.

Figure 10:
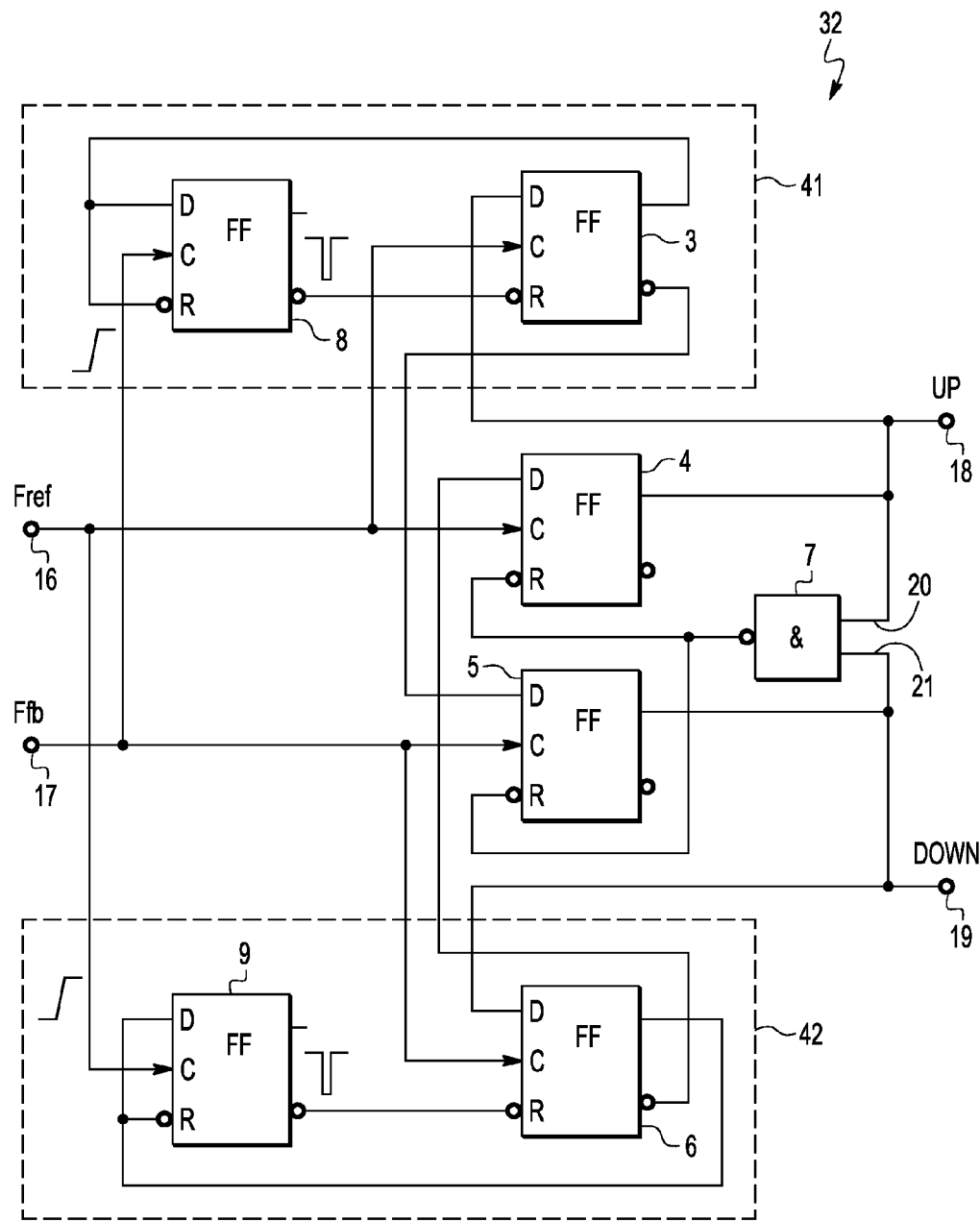
FIG. 10 schematically shows an example of an embodiment of a phase detector.

Turning now to FIG. 10, the phase detector 32 shown therein may operate in the same manner as the one described above in reference to FIGS. 3 and 4. In the present example, the rising edge detectors 1 and 2 are implemented using flip-flops 8 and 9 which may be connected as shown.

For example, the second detector input 17 may be connected to a clock input of flip-flop 8. A direct output of flip-flop 3 may be connected to both a direct input D and an inverse input R of flip-flop 8. An inverse output of flip-flop 8 may be connected to an inverse input R of flip-flop 3.

Similarly, the first detector input 16 may be connected to a clock input C of flip-flop 9. A direct output of flip-flop 6 may be connected to both a direct input D and an inverse input R of flip-flop 9. An inverse output of flip-flop 9 may be connected to an inverse input R of flip-flop 6.

Figure 11:
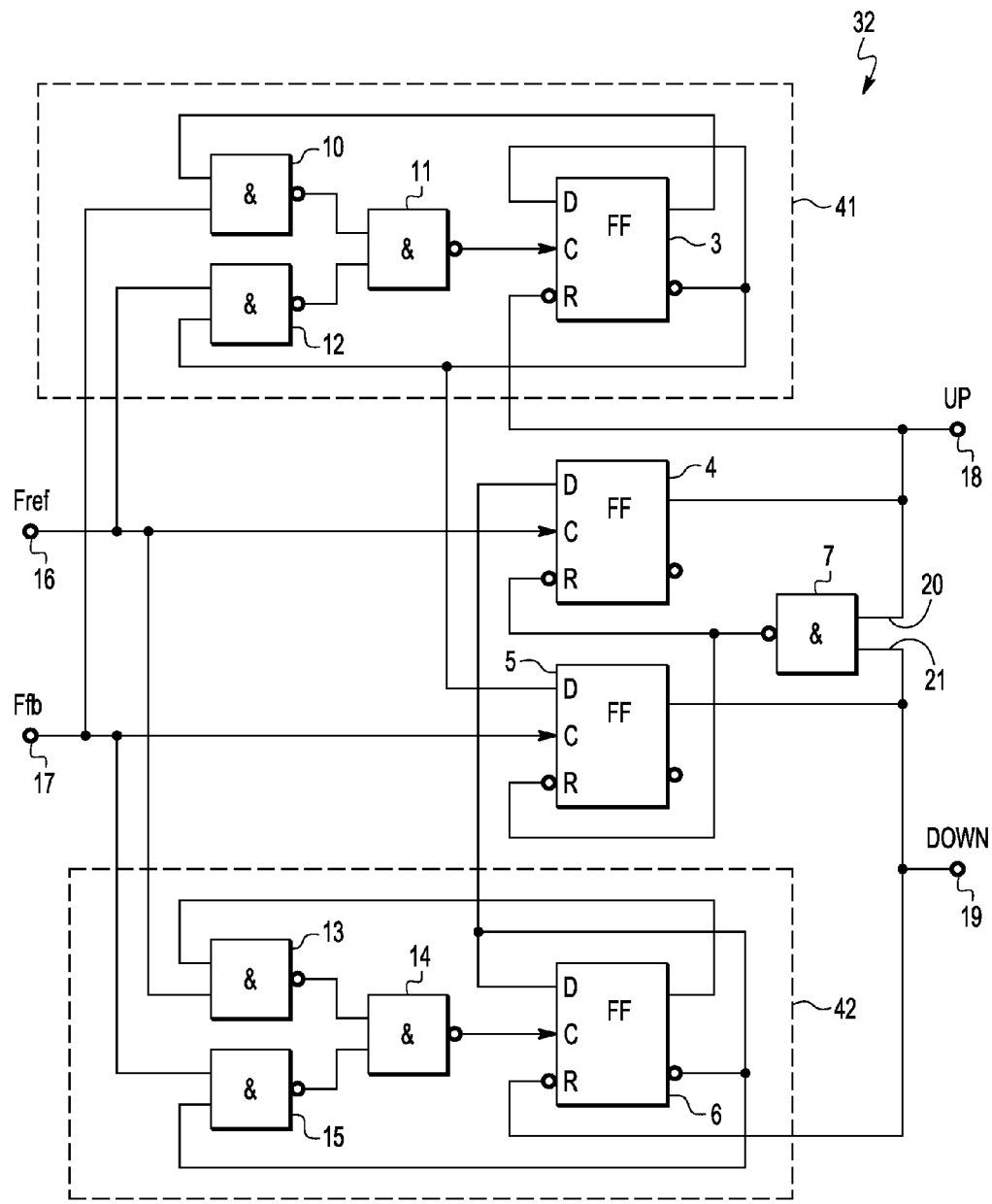
FIG. 11 schematically shows an example of an embodiment of a phase detector.
Figure 12:
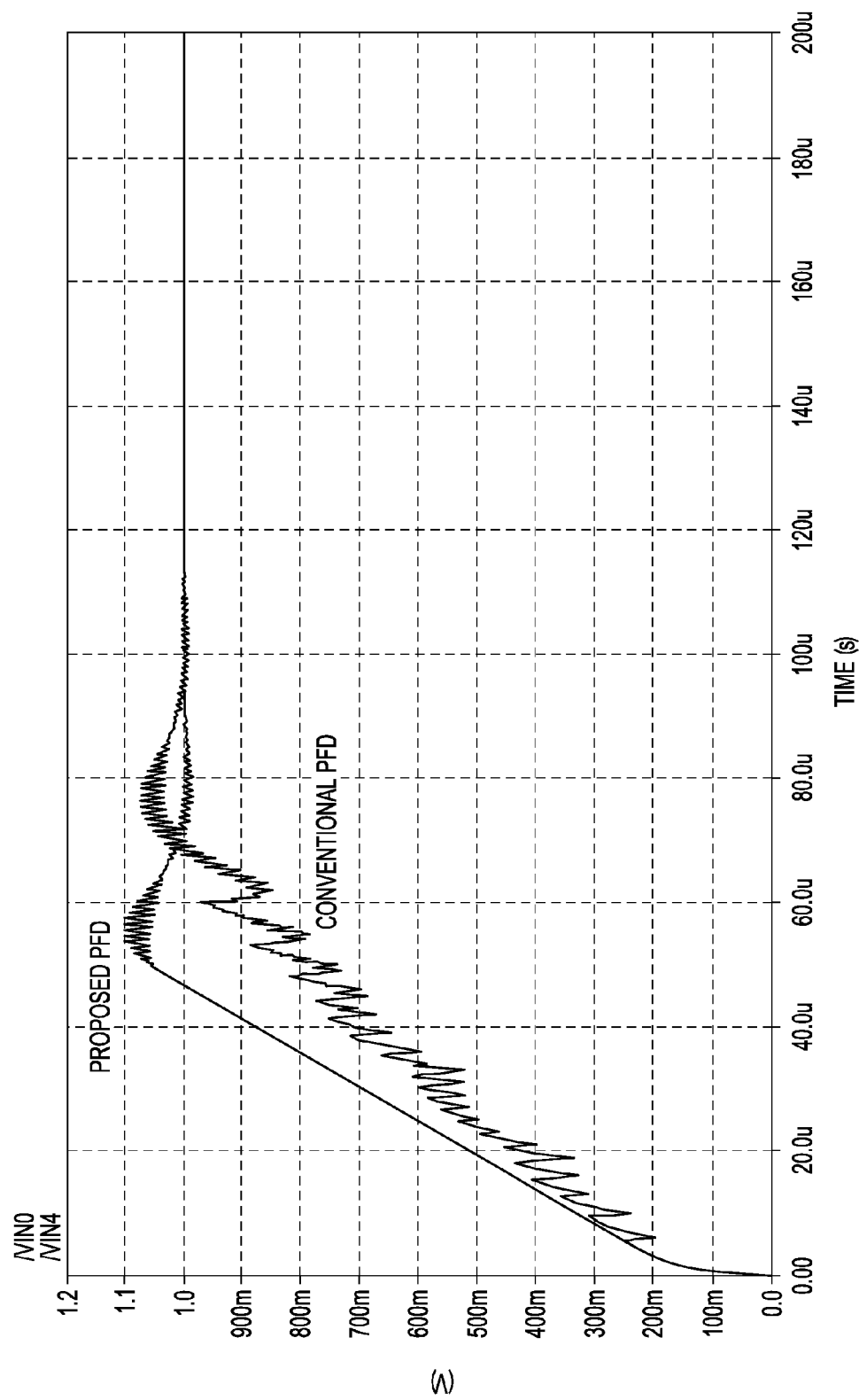
FIG. 12 shows a diagram of a VCO control voltage as a function of time for a first and a second example of a PLL, in accordance with an example of scenario.

FIG. 11 schematically illustrates another example of a phase detector 32. In this example, the first overphase detection unit 41 comprises a third flip-flop 3, a second NAND gate 12, a third NAND gate 10, and a fourth NAND gate 11. The first detector input 16 may be connected to a first input of the second NAND gate 12. The second detector input 17 may be connected to a first input of the third NAND gate 10. The direct output of the first flip-flop 4 may be connected to an inverse input R of the third flip-flop 3. A direct output of the third flip-flop 3 may be connected to a second input of the third NAND gate 10. An output of the second NAND gate 12 may be connected to a first input of the fourth NAND gate 11. An output of the third NAND gate 10 may be connected to a second input of the fourth NAND gate 11. An output of the fourth NAND gate 11 may be connected to a clock input C of the third flip-flop 3. An inverse output of the third flip-flop 3 may be connected to a direct input D of the third flip-flop 3, to a second input of the second NAND gate 12, and to the direct input D of the second flip-flop 5, thus acting as the mentioned output of the first overphase detection unit 41.

Similarly, the second overphase detection unit 42 may comprise a fourth flip-flop 6, a fifth NAND gate 15, a sixth NAND gate 13, and a seventh NAND gate 14. The first detector input 16 may be connected to a first input of the sixth NAND gate 13. The second detector input 17 may be connected to a first input of the fifth NAND gate 15. The direct output of the second flip-flop 5 may be connected to an inverse input R of the fourth flip-flop 6. A direct output of the fourth flip-flop 6 may be connected to a second input of the sixth NAND gate 13. An output of the fifth NAND gate 15 may be connected to a first input of the seventh NAND gate 14. An output of the sixth NAND gate 13 may be connected to a second input of the seventh NAND gate 14. An output of the seventh NAND gate 14 may be connected to a clock input C of the fourth flip-flop 6. An inverse output of the fourth flip-flop 6 may be connected to a direct input D of the fourth flip-flop 6, to a second input of the fifth NAND gate 15, and to the direct input D of the first flip-flop 4, thus acting as the mentioned output of the second overphase detection unit 42.

The phase detector 32 shown in FIG. 11 may have the same output behaviour as the examples described above in reference to FIGS. 3 and 10. However, its operation may be slightly different. When the flip-flops 4 and 5 are in the logic state "0", they provide "0" on the inverse inputs of the flip-flops 3 and 6 and thus "0" on the direct outputs of the flip-flops 3 and 6. When the flip-flop 4 is in the logic state "1", positive edges of the first and second input signals S1 and S2 can set and reset the flip-flop 6. The group of NAND gates 10, 11, and 12 with flip-flop 3 thus detects rising edges of the first and second input signals S1 and S2. The group of NAND gates 10, 11, and 12 thus forms a rising-edge detector similar to the rising-edge detectors 1 and 8 in FIGS. 3 and 10, wherein in difference flip-flop 3 detects rising edge of the first input signal S1 directly. Similar, the group of NAND gates 13, 14, and 15 with flip-flop 6 detects rising edges of the first and second input signals S1 and S2. The group of NAND gates 13, 14, and 15 thus forms a rising-edge detector similar to the rising-edge detectors 2 and 9 in FIGS. 3 and 10, wherein in difference flip-flop 6 detects rising edge of the second input signal S2 directly.

To summarize, the phase detector 32 described above in reference to FIGS. 3 to 11 may provide a saturated output signal when the frequencies of the two input signals are different, for example, during a capture process (locking process) of an unlocked PLL. This may speed up the locking process. Furthermore, the proposed phase detector 32 is of a simple and robust design.

In the foregoing specification, the invention has been described with reference to specific examples of embodiments of the invention. It will, however, be evident that various modifications and changes may be made therein without departing from the broader spirit and scope of the invention as set forth in the appended claims.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, The first or second overphase detection units 41 or 42 may be merged in a single unit or with the other units of the phase detector 32.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. For example, the PLL 30 may be implemented as circuitry located on a single integrated circuit. Alternatively, the examples may be implemented as any number of separate integrated circuits or separate devices interconnected with each other in a suitable manner. For example, the phase detector 32, the charge pump 34, the filter 36, the VCO 38, and the frequency divider may be implemented as separate integrated circuits.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A phase detector for generating a phase difference signal indicative of a phase difference between a first bi-level signal of frequency F1 and a second bi-level signal of frequency F2, comprising:
   a first detector input for receiving the first bi-level signal;
   a second detector input for receiving the second bi-level signal;
   a first flip-flop;
   a second flip-flop;
   a NAND gate;
   a first overphase detection unit; and
   a second overphase detection unit, wherein:
      the first detector input is connected to a clock input of the first flip-flop,
      the second detector input is connected to a clock input of the second flip-flop,
      a direct output of the first flip-flop is connected to a first input of the NAND gate,
      a direct output of the second flip-flop is connected to a second input of the NAND gate,
      an output of the NAND gate is connected to an inverse input of the first flip-flop and to an inverse input of the second flip-flop,
      an output of the first overphase detection unit is connected to a direct input of the second flip-flop and is arranged to output the level "1" in response to F1≤F2 and the level "0" in response to F1>F2, and
      an output of the second overphase detection unit is connected to a direct input of the first flip-flop and is arranged to output the level "1" in response to F2≤F1 and the level "0" in response to F2>F1.

2. The phase detector of claim 1, wherein the first overphase detection unit comprises a third flip-flop and a first rising edge detector, wherein:
   the direct output of the first flip-flop is connected to a direct input of the third flip-flop,
   the first detector input is connected to a clock input of the third flip-flop,
   the second detector input is connected to an input of the first rising edge detector,
   an output of the first rising edge detector is connected to an inverse input of the third flip-flop and is arranged to output a level "0" pulse in response to a rising edge of the second bi-level signal, and
   an inverse output of the third flip-flop is connected to the direct input of the second flip-flop, thus acting as said output of the first overphase detection unit.

3. The phase detector of claim 1, wherein the second overphase detection unit comprises a fourth flip-flop and a second rising edge detector, wherein:
the direct output of the second flip-flop is connected to a direct input of the fourth flip-flop,
the first detector input is connected to an input of the second rising edge detector,
the second detector input is connected to a clock input of the fourth flip-flop,
an output of the second rising edge detector connected to an inverse input of the fourth flip-flop and is arranged to output a level "0" pulse in response to a rising edge of the first bi-level signal, and
an inverse output of the fourth flip-flop is connected to the direct input of the first flip-flop, thus acting as said output of the second overphase detection unit.

4. The phase detector of claim 1, wherein the first overphase detection unit comprises a third flip-flop, a second NAND gate, a third NAND gate, and a fourth NAND gate, and wherein
the first detector input is connected to a first input of the second NAND gate,
the second detector input is connected to a first input of the third NAND gate,
the direct output of the first flip-flop is connected to an inverse input of the third flip-flop,
a direct output of the third flip-flop is connected to a second input of the third NAND gate,
an output of the second NAND gate is connected to a first input of the fourth NAND gate,
an output of the third NAND gate is connected to a second input of the fourth NAND gate,
an output of the fourth NAND gate is connected to a clock input of the third flip-flop, and
an inverse output of the third flip-flop is connected to a direct input of the third flip-flop, to a second input of the second NAND gate, and to the direct input of the second flip-flop, thus acting as said output of the first overphase detection unit.

5. The phase detector of claim 1, wherein the second overphase detection unit comprises a fourth flip-flop, a fifth NAND gate, a sixth NAND gate, and a seventh NAND gate, and wherein:
the first detector input is connected to a first input of the sixth NAND gate,
the second detector input is connected to a first input of the fifth NAND gate,
the direct output of the second flip-flop is connected to an inverse input of the fourth flip-flop,
a direct output of the fourth flip-flop is connected to a second input of the sixth NAND gate,
an output of the fifth NAND gate is connected to a first input of the seventh NAND gate,
an output of the sixth NAND gate is connected to a second input of the seventh NAND gate,
an output of the seventh NAND gate is connected to a clock input of the fourth flip-flop,
an inverse output of the fourth flip-flop is connected to a direct input of the fourth flip-flop, to a second input of the fifth NAND gate, and to the direct input of the first flip-flop, thus acting as said output of the second overphase detection unit.

6. The phase detector of claim 1, wherein a time average of a difference of the output voltage at the direct output of the first flip-flop and the output voltage at the direct output of the second flip-flop is indicative of said phase difference.

7. A phase-locked loop comprising an oscillator; a frequency divider; and a phase detector, wherein the phase detector generates a phase different signal indicative of a phase difference between a first bi-level signal of frequency F1 and a second bi-level signal of frequency F2 and includes a first detector input for receiving the first bi-level signal, a second detector input for receiving the second bi-level signal, a first flip-flop, a second flip-flop, a NAND gate, a first overphase detection unit, a second overphase detection unit, wherein:
the first detector input is connected to a clock input of the first flip-flop,
the second detector input is connected to a clock input of the second flip-flop,
a direct output of the first flip-flop is connected to a first input of the NAND gate,
a direct output of the second flip-flop is connected to a second input of the NAND gate,
an output of the NAND gate is connected to an inverse input of the first flip-flop and to an inverse input of the second flip-flop,
an output of the first overphase detection unit is connected to a direct input of the second flip-flop and is arranged to output the level "1" in response to F1≤F2 and the level "0" in response to F1>F2,
an output of the second overphase detection unit is connected to a direct input of the first flip-flop and is arranged to output the level "1" in response to F2≤F1 and the level "0" in response to F2>F1,
an output of the oscillator is connected to the frequency divider, an output of the frequency divider is connected to the second detector input, a reference signal is applicable at the first detector input, and an input of the oscillator is connected to the phase detector so that an oscillation frequency of the oscillator is responsive to a time-average of the voltage at the direct output of the first flip-flop minus the voltage at the direct output of the second flip-flop.

* * * * *